United States Patent
Ho

(10) Patent No.: US 7,808,092 B2
(45) Date of Patent: Oct. 5, 2010

(54) SEMICONDUCTOR DEVICE WITH A PLURALITY OF GROUND PLANES

(75) Inventor: Fan Ho, San Ramon, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 12/346,437

(22) Filed: Dec. 30, 2008

(65) Prior Publication Data

US 2009/0108393 A1 Apr. 30, 2009

Related U.S. Application Data

(63) Continuation of application No. 10/810,510, filed on Mar. 26, 2004, now abandoned.

(51) Int. Cl.
*H01L 23/02* (2006.01)
(52) U.S. Cl. .................. 257/685; 257/690; 257/723
(58) Field of Classification Search ................ 257/678, 257/685, 686, 690, 723–726
See application file for complete search history.

(56) References Cited

U.S. PATENT DOCUMENTS

| | | | |
|---|---|---|---|
| 5,266,912 A | 11/1993 | Kledzik | |
| 5,544,017 A | 8/1996 | Beilin et al. | |
| 5,635,767 A | 6/1997 | Wenzel et al. | |
| 5,814,877 A | 9/1998 | Diffenderfer et al. | |
| 5,982,635 A * | 11/1999 | Menzies et al. | 361/790 |
| 6,034,332 A | 3/2000 | Moresco et al. | |
| 6,281,590 B1 | 8/2001 | Gabara et al. | |
| 6,465,890 B1 * | 10/2002 | Poddar et al. | 257/773 |
| 2003/0009873 A1 | 1/2003 | Hatangadi et al. | |

OTHER PUBLICATIONS

Wolf, et al., "Silicon Processing for the VLSI Era," 2000, vol. I, Lattice Press, pp. 857-858.

* cited by examiner

*Primary Examiner*—Leonardo Andújar
(74) *Attorney, Agent, or Firm*—Park, Vaughan & Fleming LLP

(57) ABSTRACT

A multi-chip module (MCM) with a plurality of ground planes/layers is provided. Each integrated circuit (IC) chip of the MCM has its own ground plane on a substrate in the MCM. This MCM structure may facilitate separate testing of each IC chip without affecting other chips and without being affected by other chips. This MCM structure also may facilitate testing of interconnects/connections between two or more chips.

22 Claims, 2 Drawing Sheets

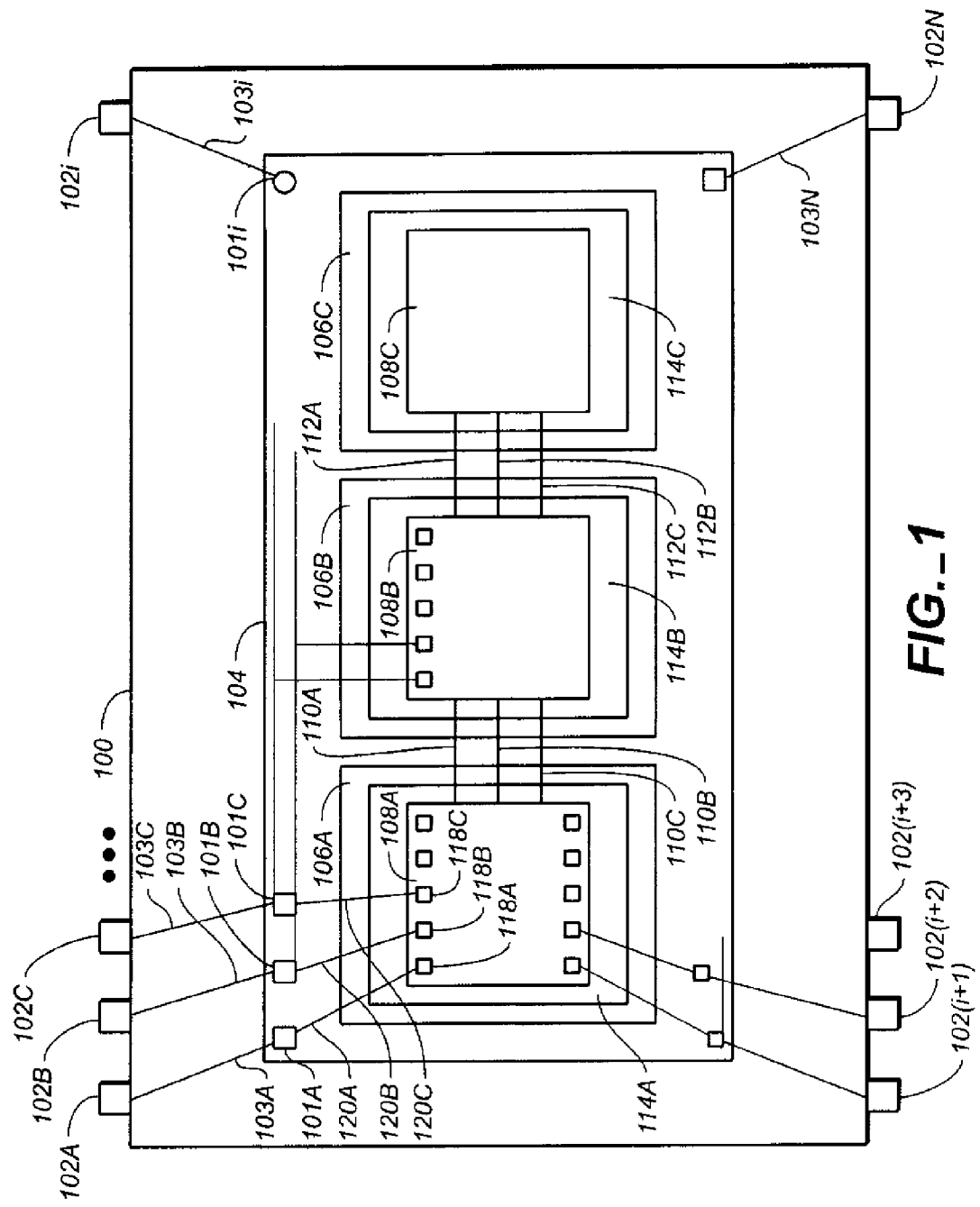
FIG._1

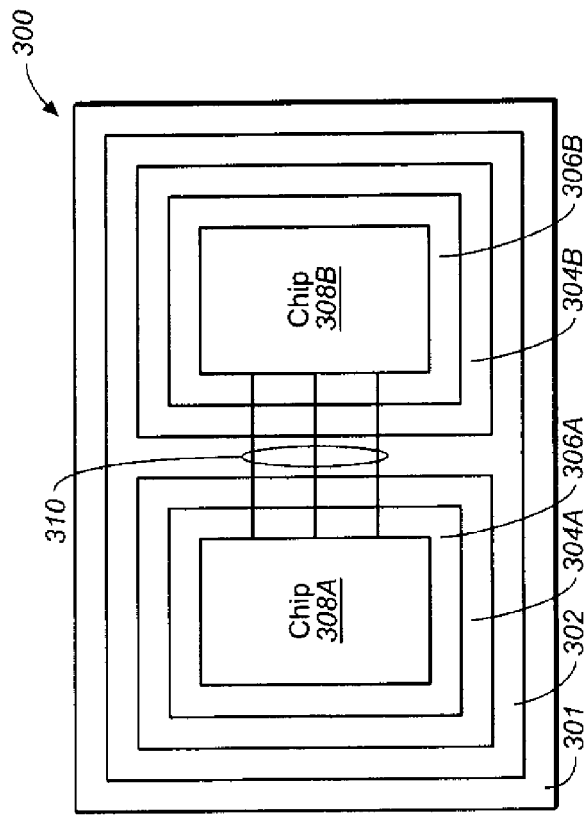
FIG._3
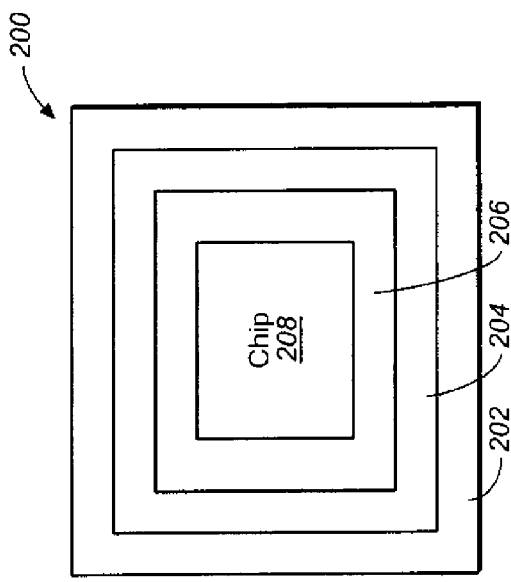
FIG._2
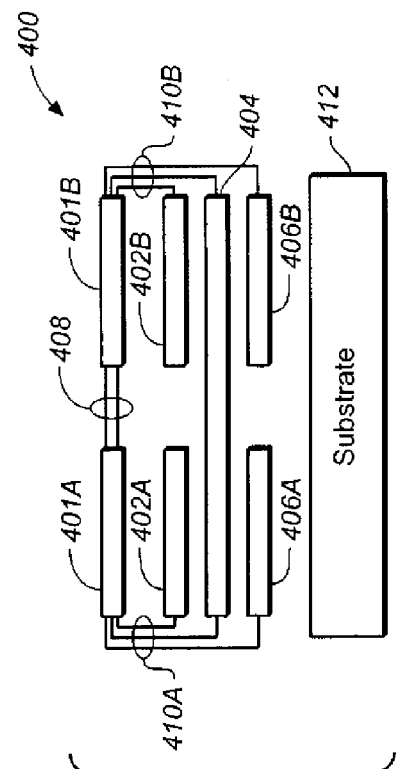
FIG._4

SEMICONDUCTOR DEVICE WITH A PLURALITY OF GROUND PLANES

CROSS-REFERENCE TO RELATED APPLICATION

The present application is a continuation of co-pending U.S. patent application Ser. No. 10/810,510, filed on Mar. 26, 2004, the entirety of which is incorporated by reference herein.

TECHNICAL FIELD OF INVENTION

The present invention relates to integrated circuits, and more specifically to a semiconductor device with a plurality of ground planes.

BACKGROUND

Conventional integrated circuit (IC) packages comprise a single integrated circuit (IC) die, which is also called a "chip." A multi-chip module (MCM) comprises a plurality of IC chips on a common or shared substrate, all contained within the same protective package. The individual IC chips in an MCM are interconnected by metallic paths formed on the substrate. The IC chips are coupled to terminals on the substrate, which may be coupled to a conventional lead frame with very thin wires. The substrate and lead frame are encapsulated within the protective package.

In some cases, the various IC chips in a conventional MCM may use different power levels. Accordingly, each IC chip in the MCM may be coupled to its own power plane, which is separate from other power planes coupled to the other IC chips in the MCM. According to previously developed techniques, all of the IC chips share a single ground plane on the MCM substrate.

Conceptually, testing of an MCM may be performed at a chip level, a package level or a system level (board level). Conventional testing of MCMs with IC chips, such as IC memory chips, usually occurs at the chip level. That is, each IC chip is manufactured and tested separately prior its incorporation in an MCM. Conventional testing methods may be time-consuming; restricted to simple, non-complex components; and/or require extra components for testing. Package-level testing has not been performed. System-level testing of MCMs is prohibitively expensive.

SUMMARY

In one embodiment, an MCM comprises an IC memory chip and an ASIC. The IC memory chip and ASIC chip may share a set of input/output (I/O) connectors (e.g., pins, pads, or balls) of the MCM. In accordance with the invention, a method separately accesses and tests the IC memory chip and the ASIC chip.

One aspect of the invention relates to a multi-chip module (MCM). The MCM comprises a first integrated circuit (IC) chip on a substrate, a first ground plane coupled to the first IC chip, a second IC chip on the substrate, and a second ground plane coupled to the second IC chip.

Another aspect of the invention relates to a method of testing first and second integrated circuit (IC) chips on a substrate in a multi-chip module. Each IC chip has its own ground plane. The method comprises testing the first IC chip without being affected by an operation of the second IC chip; and testing the second IC chip without being affected by an operation of the first IC chip.

Another aspect of the invention relates to a method of testing first and second integrated circuit (IC) chips on a substrate in a multi-chip module. Each IC chip has its own ground plane. The method comprises testing the first IC chip without being affected by an operation of the second IC chip; and testing the second IC chip without being affected by an operation of the first IC chip.

Another aspect of the invention relates to a method of testing an interconnect between first and second integrated circuit (IC) chips on a substrate in a multi-chip module. Each IC chip has its own ground plane. The method comprises applying a signal to the first IC chip and determining whether current is passed from the first IC chip to the second chip via the interconnect in response to the signal applied to the first IC chip.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIG. 1 illustrates one embodiment of a multi-chip module (MCM) with a plurality of integrated circuits (ICs), according to an embodiment of the invention.

FIG. 2 illustrates one embodiment of an IC chip structure that may be implemented in an MCM, according to an embodiment of the invention.

FIG. 3 illustrates one embodiment of a multiple IC chip structure that may be implemented in an MCM, according to an embodiment of the invention.

FIG. 4 is a cross-sectional side view of another embodiment of a multiple IC chip structure that may be implemented in an MCM, according to an embodiment of the invention.

DETAILED DESCRIPTION

The embodiments of the present invention and their advantages are best understood by referring to FIGS. 1 through 4 of the drawings. Like numerals are used for like and corresponding parts of the various drawings.

The present invention recognizes a need for cost-effective testing of integrated circuit (IC) chips (also referred to as "dies") in an MCM package (also called a "packaged device," a "packaged semiconductor device" or a "multi-chip semiconductor device"). Other aspects of testing systems, methods, and MCM structures are described in U.S. patent application Ser. No. 09/666,208, filed on Sep. 21, 2000, entitled "Chip Testing Within a Multi-Chip Semiconductor Package," U.S. patent application Ser. No. 09/967,389, filed on Sep. 28, 2001, entitled "Testing of Integrated Circuit Devices," U.S. patent application Ser. No. 10/305,635, filed on Nov. 27, 2002, entitled "Entering Test Mode and Accessing of a Packaged Semiconductor Device," and U.S. patent application Ser. No. 10/608,613, filed on Jun. 27, 2003, entitled "Bonding Pads For Testing Semiconductor Device," all of which are assigned to the present assignee and the entirety of which are incorporated by reference herein.

In accordance with one embodiment of the present invention, each IC chip within an MCM has its own ground plane/layer on the MCM substrate. IC chips with their own ground planes advantageously facilitate separate testing of each IC chip without affecting other chips and without being affected by other chips in the MCM. IC chips with their own ground planes allow customers to test IC chips, such as memory chips, in an MCM to determine whether a customer's product with an MCM is functioning properly. IC chips with their own ground planes also facilitate testing of interconnects or connections between two or more chips in the MCM. IC chips with their own ground planes also allow many different types of application-specific integrated circuits (ASICs), even ASICs without high impedance inputs, to be implemented in an MCM.

FIG. 1 illustrates one embodiment of a multi-chip module (MCM) 100, in accordance with the present invention. MCM 100 may also referred to as a "packaged device," a "packaged semiconductor device," a "multi-chip semiconductor device" or a "system in package" (SIP). MCM 100 can be packaged as a standard ball grid array (BGA) or thin quad flatpack (TQFP) having 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

As shown in FIG. 1, the MCM 100 comprises input/output (I/O) connectors 102A-102N, a substrate 104, and integrated circuit (IC) chips (also referred to as "dies") 108A-108C. Each I/O connector 102A-102N can comprise an I/O pin, a ball (of a ball grid array (BGA)), or other suitable connector for the transfer of signals into and out of MCM 100. Thus, MCM 100 may comprise a plastic ball grid array (PBGA) or other suitable packaging. Substrate 104 can be a printed circuit board (PCB) substrate, onto which IC chips 108A-108C can be mounted.

A plurality of bonding pads or terminals 101A-101N and interconnectors/traces/leads 110A-110C, 112A-112C may be incorporated in or formed on substrate 104. Connectors/traces/leads 110A-110C, 112A-112C may function to connect, and support communication between, IC chips 108A-108C. A number of bonding pads or terminals 101A-101N may be connected to one or more I/O connectors 102A-102N via leads 103A-103N, thus supporting communication between substrate 104 and circuitry external to MCM 100.

In one embodiment, at least one IC chip 108 in FIG. 1 is a memory chip, and at least one IC chip 108 is an application-specific integrated circuit (ASIC) chip. For example, in one embodiment, the IC chips 108A, 108C can be memory chips and the IC chip 108B can be an ASIC chip. The IC memory chip(s) 108A, 108C and the ASIC chip 108B may share some of the same pins/balls/pads 102A-102N of the MCM 100. The MCM 100 may comprise various combinations of different types of ASICs, even ASICs without high impedance inputs pads or input pins. In one embodiment, at least one IC chip 108 in FIG. 1 may comprise logic and embedded memory, such as an embedded dynamic random access memory (DRAM).

Each IC chip 108A-108C may comprise, or have incorporated therein, one or more bonding pads/terminals 118A-118C. Bonding wires 120A-120C or other suitable connections connect bonding pads/terminals 118 of IC chips 108 to bonding pads/terminals 101 of substrate 104.

In general, the MCM 100 may comprise any number of I/O pins/pads/balls, bonding pads, wires, leads, terminals, traces, ground planes, IC chips, interconnects/connections and power planes. The MCM 100 may comprise other components (not shown) in addition to or instead of the components shown in FIG. 1. In one embodiment, the MCM 100 has multiple layers.

A number of conductive plans 106A-106C, 114A-114C are provided, or incorporated, on substrate 104. In one embodiment, planes 106A-106C are ground planes and planes 114A-114E are power planes. In another embodiment, the structures 114A-114C are ground planes, and the structures 106A-106C are power planes. As depicted, each IC chip 108 may have its own power plane 114 and its own ground plane 106 on the MCM substrate 104. Each power plane 114 is separate from the corresponding ground plane 106. In one embodiment, each power plane 114 may have a voltage of 1.8 volts, 3.3 volts or 5 volts. In one embodiment, one or more conductive plans can be implemented as layers formed on the substrate 104, for example, by processes that are typically used to form traces on a printed circuit board (PCB). Also, in the same or other embodiments, one or more conductive plans can be implemented as a conductive mesh or strip which is attached to the substrate, for example, by any suitable bonding process. Each IC chip 108 may be bonded or otherwise attached to one or more power planes 114. Similarly, each IC chip 108 may be bonded or otherwise attached to one or more ground planes 106. For example, each chip 108 may be attached to one or more power planes 114 and/or one or more ground planes 106 via a "flip chip" attachment technique, which is known to those of ordinary skill in the art. Each chip 108 and its associated ground and power plans may form or be part of a "chip structure."

In general, a ground plane, in accordance with embodiments of the invention, may be located anywhere in the MCM and does not need to be near a corresponding IC chip. For example, the ground plane 106A may be located anywhere in the MCM 100 and does not have to be near the chip 108A. In one embodiment, a ground plane 106 is implemented on the surface of the substrate. In another embodiment, a ground plane 106 is implemented in a portion within the substrate beneath its surface. Each ground plane 106 can be coupled to an external connector of the MCM 100, such as I/O connector 102A.

A ground plane 106, in accordance with embodiments of the invention, may have any configuration and any shape, such as a strip or a layer. The size of each ground plane 106 in an MCM may vary according to the power consumption of a chip associated with the ground plane. Thus, in one embodiment, a larger ground plane 106 will be provided for a chip which consumes more power, and a smaller ground plane 106 will be provided for a chip which consumes less power. Each ground plane 106 may be made of a metal, such as copper, aluminum, gold or tungsten, or any other suitable conductive material. A ground plane 106, or portions thereof, may be substantially solid (e.g., a single "sheet") or partially divided into a plurality of interconnected pieces (e.g., a grid, a mesh or a perforated design). A ground plane 106 may be flexible or non-flexible (rigid).

FIG. 2 illustrates one embodiment of an IC chip structure 200 that may be implemented in the MCM 100 of FIG. 1. The structure 200 in FIG. 2 comprises a first conductive plane 202, a second conductive plane 204, a third conductive plane 206 and an IC chip 208. The conductive planes 202, 204, 206 may comprise a ground plane and two power planes with two voltage levels, such as 1.8, 3.3 or 5 volts. Conductive plans 202, 204, and 206 may be separated (e.g., electrically isolated) with suitable insulative or non-conductive layers (not shown). FIG. 2 illustrates an IC chip structure 200 having multiple power planes.

FIG. 3 illustrates one embodiment of a multiple IC chip structure 300 that may be implemented in the MCM 100 of FIG. 1. The structure 300 in FIG. 3 comprises a plurality of conductive planes 301, 302, 304A, 304B, 306A, 306B and a plurality of IC chips 308A, 308B. Conductive plans 301, 302, 304A, 304B, 306A, 306B may be separated (e.g., electrically isolated) with suitable insulative or non-conductive layers (not shown). Each IC chip 308 in FIG. 3 may be provided with its own ground plane and one or more power planes. For example, the chip 308A may be coupled to a ground plane 306A and three power planes 304A, 302, 301. In one embodiment, the voltage levels of the power planes 304A, 302, 301 may be 1.8, 3.3 or 5 volts (in any desired order). FIG. 3 demonstrates that a plurality of IC chips 308A, 308B may share at least one power plane, such as the plane 302 or the plane 301. The chip 308A may be coupled to the chip 308B via interconnects 310.

FIG. 4 is a cross-sectional side view of another embodiment of a multiple IC chip structure 400 that may be implemented in the MCM 100 of FIG. 1. The structure 400 in FIG. 4 comprises a first IC chip 401A, a second IC chip 401B, a plurality of layers or planes 402A, 402B, 404, 406A, 406B and a substrate 412. The chips 401A, 401B, planes 402A, 402B, 404, 406A, 406B and substrate 412 may be vertically separated by dielectric layers or layers of one or more insulative or non-conductive materials. In one embodiment, one or more of the planes 402A, 402B, 404, 406A, 406B may be embedded in a part of the substrate 412.

The chips 401A, 401B in FIG. 4 may be coupled via one or more connectors or leads or traces 408. The chips 401A, 401B may be coupled to the planes 402A, 402B, 404, 406A, 406B connectors (e.g., vias) 410A, 410B. In one embodiment, the planes 402A, 402B, 404 are power planes, and the planes 406A, 406B are ground planes. The plane 404 may be a power plane shared by the two IC chips 401A, 401B.

The MCM 100 and structures described herein may be tested at a chip level, a package level or a system level. In some situations, it is desirable to test at the chip level because normal test routines designed for each chip can be used for testing, thus, allowing faulty chips to be identified and isolated or repaired.

In one embodiment, a testing device accesses and tests each IC chip, such as the chip 108B in FIG. 1, separately from other chips, such as the chips 108A, 108C.

The ground planes described herein with reference to FIGS. 1-4 facilitate separate testing of each chip, such as chip 108B (FIG. 1). For example, ground plane 106B allows corresponding chip 108B to be tested without affecting the operation or voltage/current levels of other chips, such as chips 108A, 108C. Specifically, each chip 108 in the MCM 100 of FIG. 1 can be activated (i.e., powered-up) and tested without supplying power to other chips 108 in the MCM 100. Similarly, the ground planes described herein with reference to FIGS. 1-4 facilitate separate testing of each chip, such as chip 108B (FIG. 1), without being affected by the operation or voltage/current levels of other chips, such as chips 108A, 108C. For example, the various and separate ground planes allow for complete isolation between and among chips 108.

The structures described above may also facilitate testing of interconnects/connections/traces between two or more chips, such as, for example, the interconnects 110A-110C, 112A-112C between chips 108A, 108B, 108C in FIG. 1. In one embodiment, a testing device tests the interconnects 110A-110C, 112A-112C by examining a current change on each interconnect 110 or 112 in response to a signal sent to a chip 108. In another embodiment, a device tests the interconnects 110A-110C, 112A-112C by determining whether each interconnect 110 or 112 passes current. If an interconnect 110 or 112 does not pass current, then the interconnect has a broken connection. An MCM with a defective interconnect may be discarded or repaired.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A multi-chip module (MCM) comprising:
    a first integrated circuit (IC) chip on a substrate;
    a first ground plane coupled to the first IC chip;
    a second IC chip on the substrate; and
    a second ground plane coupled to the second IC chip,
        wherein the first IC chip and the second IC chip are in a same MCM package;
        wherein the first and second ground planes are configured to allow separate testing of each of the first and second IC chips.

2. The MCM of claim 1, wherein each of the first and second ground planes is coupled to at least one external lead of the MCM.

3. The MCM of claim 1, wherein the first ground plane is formed as a trace on the first substrate and the second ground plane is formed as a trace on the second substrate.

4. The MCM of claim 1, wherein each of the first and second ground planes is substantially rigid.

5. The MCM of claim 1, wherein each of the first and second ground planes is substantially flexible.

6. The MCM of claim 1, wherein each of the first and second ground planes comprises a strip of conductive material.

7. The MCM of claim 1, wherein each of the first and second ground planes comprises a layer of conductive material.

8. The MCM of claim 1, wherein each of the first and second ground planes comprises a substantially solid layer of conductive material.

9. The MCM of claim 1, wherein each of the first and second ground planes comprises a grid of conductive material.

10. The MCM of claim 1, wherein the first chip is bonded to the first ground plane, and the second chip is bonded to the second ground plane.

11. The MCM of claim 1, wherein the first chip is attached to the first ground plane, and the second chip is attached to the second ground plane.

12. The MCM of claim 1, wherein at least one of the first and second chip comprises a dynamic random access memory (DRAM) chip.

13. The MCM of claim 12, wherein the first and second chips are attached to the first and second ground planes via a flip-chip technique.

14. The MCM of claim 1, wherein at least one of the first and second chips comprises a memory chip.

15. The MCM of claim 1, wherein at least one of the first and second chip comprises an application specific integrated circuit (ASIC).

16. The MCM of claim 1, wherein one of the first and second chips is coupled to a plurality of input/output connectors of the MCM and the other of the first and second chips is not coupled to any input/output connectors of the MCM.

17. The MCM of claim 1, wherein the first chip is coupled to the second chip via at least one trace.

18. The MCM of claim 1, wherein at least one of the first and second chips may be tested without affecting operation of the other of the first and second chips in the MCM.

19. The MCM of claim 1, wherein at least one of the first and second chips may be tested without being affected by an operation of one or more other chips in the MCM.

20. The MCM of claim 1, further comprising:

a first power plane coupled to the first IC chip; and a second power plane couple to the second IC chip.

21. A method, comprising:

testing a first IC chip attached to a first ground plane while the first ground plane is coupled to a power supply;

decoupling the first ground plane from the power supply; and testing a second IC chip attached to a second ground plane while the second ground plane is coupled to the power supply and while the second ground plane is electrically isolated from the first ground plane;

wherein the first IC chip and the second IC chip are in a same MCM package.

22. The method of claim 21, further comprising testing an interconnect between the first and second IC chips while both of the first and second ground planes are coupled to the power supply.

* * * * *